United States Patent [19]
Adams et al.

[11] Patent Number: 5,141,597
[45] Date of Patent: Aug. 25, 1992

[54] THIN POLYSILICON RESISTORS

[75] Inventors: James R. Adams; James C. Weaver, both of Colorado Springs, Colo.

[73] Assignee: United Technologies Corporation, Hartford, Conn.

[21] Appl. No.: 613,333

[22] Filed: Nov. 14, 1990

[51] Int. Cl.$^5$ .............................. H01L 21/00
[52] U.S. Cl. ...................... 156/628; 156/657; 437/186; 437/233; 437/247; 437/918
[58] Field of Search ............... 437/46, 186, 193, 918, 437/233, 247; 156/628, 657, 662, 659.1

[56] References Cited

U.S. PATENT DOCUMENTS

| | | | |
|---|---|---|---|
| 3,902,926 | 9/1975 | Perloff et al. | 437/918 X |
| 3,947,866 | 3/1976 | Stellrecht | 437/918 X |
| 4,560,419 | 12/1985 | Bourassa et al. | 437/46 |
| 4,653,176 | 3/1987 | Van Ommen | 437/918 X |
| 4,692,998 | 9/1987 | Armstrong et al. | 156/659.1 X |
| 4,701,241 | 10/1987 | Schlesier | 156/659.1 X |

FOREIGN PATENT DOCUMENTS

| | | | |
|---|---|---|---|
| 0066941 | 3/1989 | Japan | 156/628 |
| 0125461 | 5/1990 | Japan | 437/46 |

Primary Examiner—Thi Dang

[57] ABSTRACT

Polycrystalline silicon resistors are formed by reducing the initial thickness of a poly layer to a magnitude such that the etch end point of the lightly doped resistors is equal to the etch end point of the heavily doped interconnection.

5 Claims, 1 Drawing Sheet

THIN POLYSILICON RESISTORS

DESCRIPTION

1. Technical Field

The field of the invention is that of silicon integrated circuit processing, in particular, the fabrication of resistors from doped polycrystalline silicon.

2 Background Art

It is conventional in the art to use resistors made from polycrystalline silicon (poly), which is a standard interconnection layer that is conventionally used for transistor gates and/or relatively short connections within the circuit. The resistors are made by doping at an appropriate concentration to produce a portion of the polycrystalline silicon layer that has a relatively high resistivity. A drawback in the prior art has been that the poly resistors formed by this method have a very high temperature coefficient, on the order of 3000 ppm/.C. In some memory circuits, the result of this temperature dependence is a change in write pulse width from 20 ns to 100 ns over the military temperature range, with a variation in write pulse width at room temperature of half that amount.

Since circuits must be designed to operate with this wide range of widths and wide range in resistivity, the art has long sought a method of providing a more accurate resistance.

DISCLOSURE OF INVENTION

The invention relates to an improved method of forming polysilicon resistors in which a layer of undoped polycrystalline silicon is deposited; the resistor area is defined and etched down to an appropriate thickness less than the thickness of the remainder of the poly interconnection regions; the interconnection regions of the poly are implanted with a heavy dose to provide appropriate conductivity while the resistor areas are protected by photoresist; the protective coating over the resistor area is stripped and the entire poly layer is implanted with the implant dose appropriate for the resistance regions; the poly is annealed and then the interconnection regions and the resistor regions are defined by patterning and etching steps.

Other features and advantages will be apparent from the specification and claims and from the accompanying drawings which illustrate an embodiment of the invention.

BEST MODE FOR CARRYING OUT THE INVENTION

Referring to Table I, there is listed a method for treating a poly layer according to the invention. Starting with a poly layer deposited above an insulating layer, one defines an area that will contain the resistors and reduces the thickness, the remainder of the poly is implanted to provide interconnection regions as required, the entire layer is implanted to dope the resistors appropriately and the resistors and interconnects are defined by patterning and etching steps.

Figure 1:
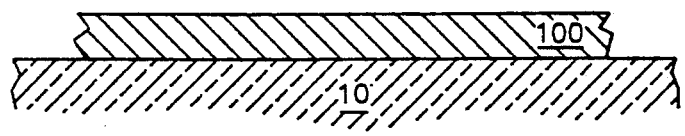
FIG. 1 illustrates in cross section a polycrystalline layer.

Referring to FIG. 1, there is shown in cross section a lower layer 10 and a polycrystalline layer 100. The poly layer 100 is shown as being the first level poly and resting on an insulating layer 10 such as silicon oxide, for convenience in the drawing. Those skilled in the art will readily appreciate that the invention may be applied to a second level poly if desired. The poly has a typical thickness of 200-600 nm.

Figure 2:
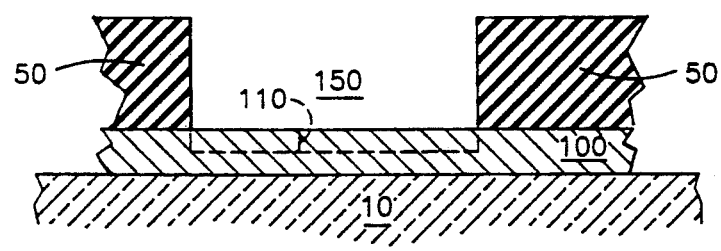
FIG. 2 illustrates an initial etching step in the invention.

FIG. 2 illustrates a step in which an aperture 150 has been formed in a layer of photoresist 50. The poly layer 110 within aperture 150 will be etched down to a reduced thickness of 100-450 nm that is determined as described below.

Figure 3:
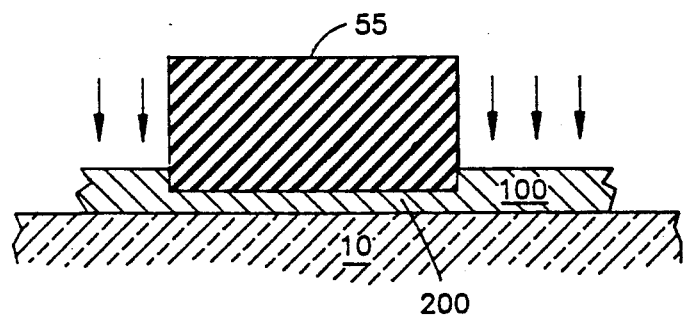
FIG. 3 illustrates an implant step for the interconnections.

After the resistor areas have been reduced in thickness, another layer of photoresist 55 is applied and patterned with the inverse mask that was used to define the resistor areas, as is shown in FIG. 3, so that a protective coating of photoresist 55 remains over the reduced thickness area 200. A heavy implant dose of conventional magnitude is applied to the remainder of the poly sheet 100 that is outside the resistor areas. These implanted remainder areas will be used to define the poly interconnections on this layer. Those skilled in the art will realize that the sequence of operations may be varied as is preferred. For example, the poly interconnect pattern could be defined before the thickness reduction step and the light implant for the resistor portion could be applied before the heavy dose for the interconnect. Further, the poly sheet could be deposited with a dopant such that the initial sheet had the appropriate resistivity for the resistor areas.

Figure 4:
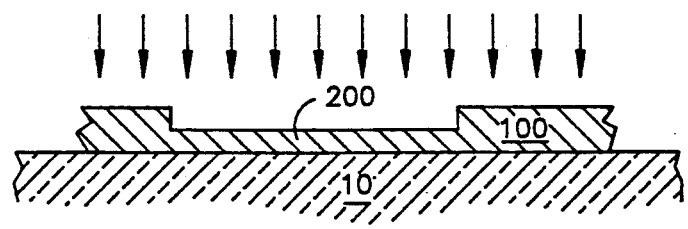
FIG. 4 illustrates an overall implant step.

Referring now to FIG. 4, the photoresist has been stripped and an overall implant across the entire chip is applied with a lighter implant dose appropriate to provide the desired conductivity in the resistor areas. Illustratively, the interconnection implant dose is N++ (approximately $10^{16}/cm^2$) and the resistor implant dose is approximately $3.6 \; 10^{14}/cm^2$.

The final steps in forming resistors in accordance with the method of the present invention involve the conventional steps of annaling the poly layer 100, patterning the poly layer, and electrically activate the resistors, and a final photoresist patterning and etch step to form the resistors with desired characteristics.

Those skilled in the art will readily appreciate that the resistance of the resistance area 200 depends on both the length and the thickness of the poly layer in that area as well as on the doping concentration. In addition, the etch rate with which the etching fluid or plasma attacks poly layer 100 in the final etch step depends on the doping concentration. The etch rate is different for intrinsic silicon, or lightly doped silicon as used in area 200, and heavily doped silicon as used in the remainder of layer 100.

In the prior art, when the thickness of poly layer 100 was constant in both the interconnection areas and the resistor areas, the difference in etching rates resulted in either over-etching or under-etching. If the final etching step was timed so that the heavily doped area of the poly was etched out, then the lightly doped areas for the resistors, where the etching rate is lower, would not be completely etched and there would be portions of poly remaining where the lightly doped poly should have been final etched away. If the etching step was timed to remove the lightly doped poly, then it would over-etch the heavily doped poly and remove material in areas of the circuit which could destroy the circuit such as etching through source or drain areas or thinning the field oxide.

With the present invention, the thickness of poly area 200 is set such that the etch end point for the thicker poly area 100 and the etch end point for the thinner poly area 200 are both essentially the same, i.e., that etching in the final etch step thickness (zero in this case) in the lightly doped resistor areas and the heavily doped interconnection areas. Thus, the problem of under- or over-etching is solved by the preliminary adjustment of the thickness carried out in the initial etching step.

With a conventional etchant of $CF_4$ or similar plasma at an ambient temperature in the range of 15° C.- 100° C., the etch rate of the heavily doped interconnection area of the poly where the poly interconnects will be formed is approximately 100-600 nm/min. The etch rate of the thinner resistor area of the poly where the resistors will be formed is approximately 325 nm/min, so that with the normal thickness of 4500Å-4900Å for the interconnection areas and 3000Å-3200Å for the resistor areas, both areas will have the same etch end point as a result of the initial etch step and doping concentration differences. Those skilled in the art will readily be able to calculate appropriate resistor area thicknesses for other etchants to achieve the same result.

The application of the lightly doped poly implant over the entire wafer eliminates alignment problems in the implantation of two different areas. Since the magnitude of the resistor implant dose is much less than that of the interconnection implant dose, there is essentially no effect on the resistivity of the interconnection areas. There is, however, no danger that alignment tolerance will result in there being an area of intrinsic silicon left that should have been doped. This provides substantially improved control over the resistor value, since the effective length of the resistor is not affected by photomask alignment tolerance.

A further advantage of the invention is that the reduced thickness of the resistor areas 200 means that the area required to produce a given resistance is less, so that the size of the circuit is less.

Although the temperature coefficient of the resistor areas is still greater than the coefficient for the interconnection areas, it is closer for this resistor than for full-thickness ones.

The application of this invention to resistors used in an SRAM cell has resulted in a considerable improvement in consistency of the resistors. For example, the write pulse variation in the prior art that ranged from 20 ns to 100 ns has been changed to less than 10 ns as a result of an application of the invention.

It should be understood that the invention is not limited to the particular embodiments shown and described herein, but that various changes and modifications may be made without departing from the spirit and scope of this novel concept as defined by the following claims.

TABLE I

Prepare Substrate
Deposit Intrinsic Poly
Define Resistor Area and Etch Down
Cover Resistor Area and Implant Interconnect
Strip photoresistor in the Resistor area and Implant all Poly
Anneal Poly
Define Resistors and Interconnect and Etch
Continue with Metal and Other Layers

We claim:

1. A method of forming a resistor in a layer of polycrystalline silicon comprising the steps of:
depositing a layer of polycrystalline silicon above a silicon substrate with an initial layer thickness and an initial layer dopant concentration and having an initial layer etch rate for a predetermined etching method;
etching a predetermined resistor area of said layer to a resistor thickness less than said initial layer thickness;
covering said resistor area with a protective coating for blocking implanted ions;
implanting that portion of said layer of polycrystalline silicon outside said protective coating with a connection implant of predetermined interconnection dopant magnitude to form an interconnection area of said poly layer, whereby said interconnection area has an interconnection etch rate and an interconnection etch end point for said initial layer thickness and for said predetermined etching method, said resistor layer thickness and said predetermined initial layer etch rate determine a resistor etch end point and are related to said initial layer thickness and said interconnection etch rate such that said interconnection etch end point and said resistor etch end point are substantially equal;
patterning said layer of polycrystalline silicon to define said resistor; and
etching said layer to form said resistor.

2. A method according to claim 1, in which said initial layer dopant concentration is substantially zero and further including a step of implanting both said resistor area and said interconnection area with a predetermined resistor implant dose, whereby said resistor area has a resistor etch rate and said resistor thickness and said resistor etch rate combine to determine a resistor etch end point substantially equal to said interconnection end point.

3. A method according to claim 1, in which said initial layer dopant concentration has a predetermined value such that said resistor areas has a predetermined resistivity.

4. A method according to claim 2, in which said step of etching a predetermined resistor area precedes said step of covering said resistor area and said step of implanting said polycrystalline silicon layer outside said resistor area.

5. A method according to claim 3, in which said step of etching a predetermined resistor area precedes said step of covering said resistor area and said step of implanting said polycrystalline silicon layer outside said resistor area.

* * * * *